(12) United States Patent
Ardron et al.

(10) Patent No.: US 8,723,799 B2
(45) Date of Patent: May 13, 2014

(54) CAPACITIVE SENSING KEYBOARD

(75) Inventors: Neil Ardron, Georgetown (CA); Paul Dwight Haist, Toronto (CA); Jordan Varley, Mississauga (CA)

(73) Assignee: Psion Inc., Mississauga, Ontario (CA)

( * ) Notice: Subject to any disclaimer, the term of this patent is extended or adjusted under 35 U.S.C. 154(b) by 203 days.

(21) Appl. No.: 13/304,345

(22) Filed: Nov. 24, 2011

(65) Prior Publication Data
US 2013/0135207 A1    May 30, 2013

(51) Int. Cl.
G09G 5/00    (2006.01)

(52) U.S. Cl.
USPC ............. 345/168; 178/18.01; 178/18.06

(58) Field of Classification Search
USPC ........... 345/168–172, 173; 178/18.06, 18.01; 341/22; 379/433.07; 400/17; 84/719
See application file for complete search history.

(56) References Cited

U.S. PATENT DOCUMENTS

| | | | |
|---|---|---|---|
| 2002/0025837 A1* | 2/2002 | Levy | 455/566 |
| 2006/0138232 A1* | 6/2006 | Hammerslag et al. | 235/440 |
| 2007/0182715 A1* | 8/2007 | Fyke et al. | 345/169 |
| 2010/0259503 A1* | 10/2010 | Yanase et al. | 345/174 |
| 2010/0265213 A1* | 10/2010 | Chen et al. | 345/174 |
| 2010/0309130 A1* | 12/2010 | Zhao et al. | 345/168 |
| 2011/0050620 A1* | 3/2011 | Hristov | 345/174 |
| 2012/0139841 A1* | 6/2012 | Taylor et al. | 345/168 |

* cited by examiner

*Primary Examiner* — Abbas Abdulselam
*Assistant Examiner* — Gerald Oliver

(57) ABSTRACT

A novel capacitive sensing keyboard allows for keypads to be easily changed for repair or reconfiguration purposes. The keypads can be made of a deformable and resilient material, such as an elastomer, which can provide tactile feedback to a user and which are relatively inexpensive to manufacture. An array of overlying pairs of driver elements and sense elements are located adjacent the keypad and changes in the dielectric value of materials about the driver/sense element pairs are detected when a key on the keypad is pressed by a user. These detected changes are processed in view of a defined key map to determine which key or keys have been pressed by the user.

22 Claims, 9 Drawing Sheets

CAPACITIVE SENSING KEYBOARD

FIELD OF THE INVENTION

The present invention relates generally to a keyboard for a computing device. More specifically, the present invention relates to a keyboard which uses capacitive sensing to detect the press of one or more keys on the keyboard.

BACKGROUND OF THE INVENTION

Computing devices can include a variety of means to permit user input, perhaps the most common of which is a keyboard. Depending on the intended application of the computing device, different arrangements and/or numbers of keys can be provided. For example, numeric keyboards can be provided for tasks relating to numeric input, alphabetic keyboards can be provided for tasks requiring text input and alphanumeric keyboards can be provided for tasks requiring both text and numeric input. Further, special purpose keys, such as Function keys, modifier keys (ALT, CTRL, etc), or hardware specific keys (such as SCAN keys for barcode scanners) can be provided.

The selection and arrangement of keys provided by a keyboard can also differ based upon different cultures and/or languages of expected users. For example, QWERTY keyboards are commonly used for English speaking users, AZERTY keyboards may be preferred by French speaking users, QWERTZ keyboards may be preferred by German speaking users, etc.

One way to address the desire or need for different keyboards has been to design, manufacture and make available multiple keyboards for each computing device, an appropriate one of which keyboards can be installed depending on the various applications envisaged for the computing device. Typically these different keyboards are only installed at time of manufacture of the computing device or require a service technician to install them after manufacture. In the former case, the computing device is less adaptable than might otherwise be desired and in the latter case, the cost of change the keyboard may be higher than is otherwise desired.

Another problem with conventional keyboards is that keyboards tend to inevitably wear with use as they have moving parts. Typically, when this wear results in a failure, the computing device must be returned to a maintenance/service depot for a service technician to change or replace the keyboard.

Another issue which exists with keyboards for computing devices is the issue of sealing the keyboard to inhibit the ingress of foreign matter into the keyboard and/or computing device enclosure. Such sealing issues are particularly important for portable, handheld and/or industrial devices which may be subject to the intrusion of dust, moisture or other foreign materials into the device enclosure resulting in impaired performance, or total failure, of the computing device and/or the keyboard itself.

Prior attempts to provide a sealed keyboard have been subject to a trade off between ease of use, user ergonomic factors, durability, price and quality of seal. Some prior solutions have employed membranes to seal the keyboards. In these systems, if the membrane is punctured (which can happen over time with even normal use), foreign material can enter the computing device through the puncture, possibly resulting in damage to the computing device. Further, if the membrane overlies, or forms, the keys of the keyboard, a loss of tactile feedback and/or decreased user performance can result.

More recently, computing devices have employed touchscreen displays upon which virtual keyboards are displayed. While such systems avoid having moving parts and mitigate the issues with sealing and/or different keyboard layouts, touchscreens generally provide poor keyboard ergonomics for any but small input tasks as there is no tactile feedback provided to the user. Further, touchscreens may not be suitable for computing devices intended for rugged use or industrial environments as touchscreen displays are relatively fragile and/or can prevent users wearing hand protection (gloves) from using their keyboards.

It would therefore be advantageous for a manufacturer of computing devices to provide a keyboard that provides good ergonomics, is sealed to prevent the ingress of foreign material into the computing device, can relatively easily be reconfigured to provide different keypad layouts/designs and which can be relatively easily serviced or repaired.

SUMMARY OF THE INVENTION

It is an object of the present invention to provide a novel capacitive sensing keyboard which obviates or mitigates at least one disadvantage of the prior art.

The present invention provides a novel capacitive sensing keyboard which allows for keypads to be easily changed for repair or reconfiguration purposes. The keypads can be made of a deformable and resilient material, such as an elastomer, which can provide tactile feedback to a user and which are relatively inexpensive to manufacture. An array of overlying pairs of driver elements and sense elements are located adjacent the keypad and changes in the dielectric value of materials about the driver/sense element pairs are detected when a key on the keypad is pressed by a user. These detected changes are processed in view of a defined key map to determine which key or keys have been pressed by the user. A variety of keypads can be employed, with different numbers and/or configurations of keys, only requiring that an appropriate key map, associating signals from one or more overlying pairs of driver elements and sense elements to keys on the keypad, be used to determine the keys pressed. The keyboard has no moving parts, and is thus relatively robust, and advantageously and easily lends itself to use with sealed electronic enclosures.

In a first aspect of the present invention, there is provided a keyboard for detecting a key press and providing corresponding input data to an electronic device, the keyboard comprising: a substrate; at least two driver elements on the substrate; at least two sense elements on the substrate, each sense element overlying a respective driver element; a voltage source; a selector to selectively apply voltage from the voltage source to at least one of the at least two driver elements to induce an electric field about the respective driver element and its respective overlying sense element to create a charge and corresponding voltage on the respective sense element; a timer to determine the time required for the created corresponding voltage on the respective sense element to reach a predefined voltage; a keypad having at least one key formed thereon, the keypad being formed of a resilient and deformable material, the at least one key being located adjacent at least one of the at least two sense elements such that when the at least one key is depressed, the dielectric value of the materials within the induced electric field is altered, the altered dielectric value changing the time required for the created charge on the respective sense element to reach a predefined voltage; a computing device responsive to changes in the time required for the corresponding voltage on the respective sense element to reach the predefined voltage and responsive to a predefined key map relating keys on the keypad to the position of sense elements on the substrate to determine which key has been depressed and outputting an indication of that key as input data to the electronic device.

Preferably, the selector, voltage source, timer and computing device comprise subsystems of a microcontroller. Also preferably, the keypad can be exchanged for a keypad with at least one of a different number of keys, a different key layout and a different set of keys by exchanging the keypad and loading a corresponding predefined key map into the computing device.

Also preferably, the at least one key formed on the keypad includes an activation element formed of a material selected to enhance the alteration of the dielectric value of the materials within the induced electric field change when the key is pressed.

Also preferably, the activation element is an electrical conductor and the keyboard further includes at least one grounded conductor arranged between the at least one key and the at least two sense elements such that when the at least one key is depressed, the activation element electrically contacts the grounded conductor and is grounded which decreases the dielectric value of the materials within the induced electric field.

BRIEF DESCRIPTION OF THE DRAWINGS

Embodiments of the present invention will now be described, by way of example only, with reference to the following Figures in which.

DETAILED DESCRIPTION OF THE INVENTION

Figure 1:
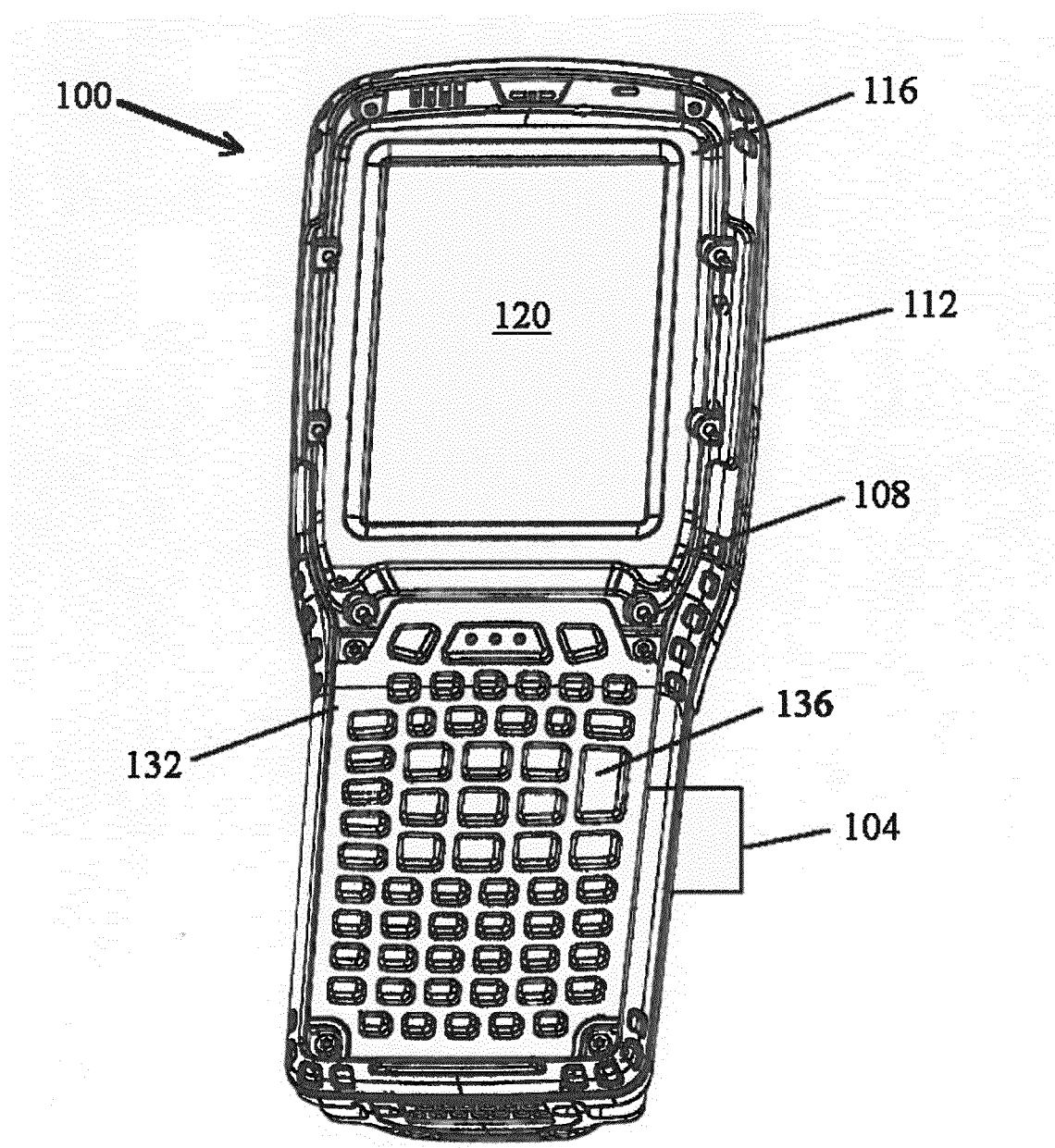
FIG. 1 shows a computing device having a keyboard in accordance with the present invention.

A computing device, including a capacitive sensing keyboard in accordance with the present invention, is indicated generally at 100 in FIG. 1. Device 100 includes a housing 104 which is formed of two or more components. In the illustrated embodiment, housing 104 includes a front shell 108, a rear shell 112 and can include a bezel 116 for a display screen 120 and a bezel 132 for a keypad 136.

As will be apparent to those of skill in the art, housing 104 is not limited to such a configuration and can instead, or in addition, include more or fewer components or a variety of other components (not shown), including end caps, expansion pods for accessories, etc. Further, computing device 100 need not be a handheld device and can be a portable or fixed place computing device and housing 104 will be constructed accordingly.

Figure 2:
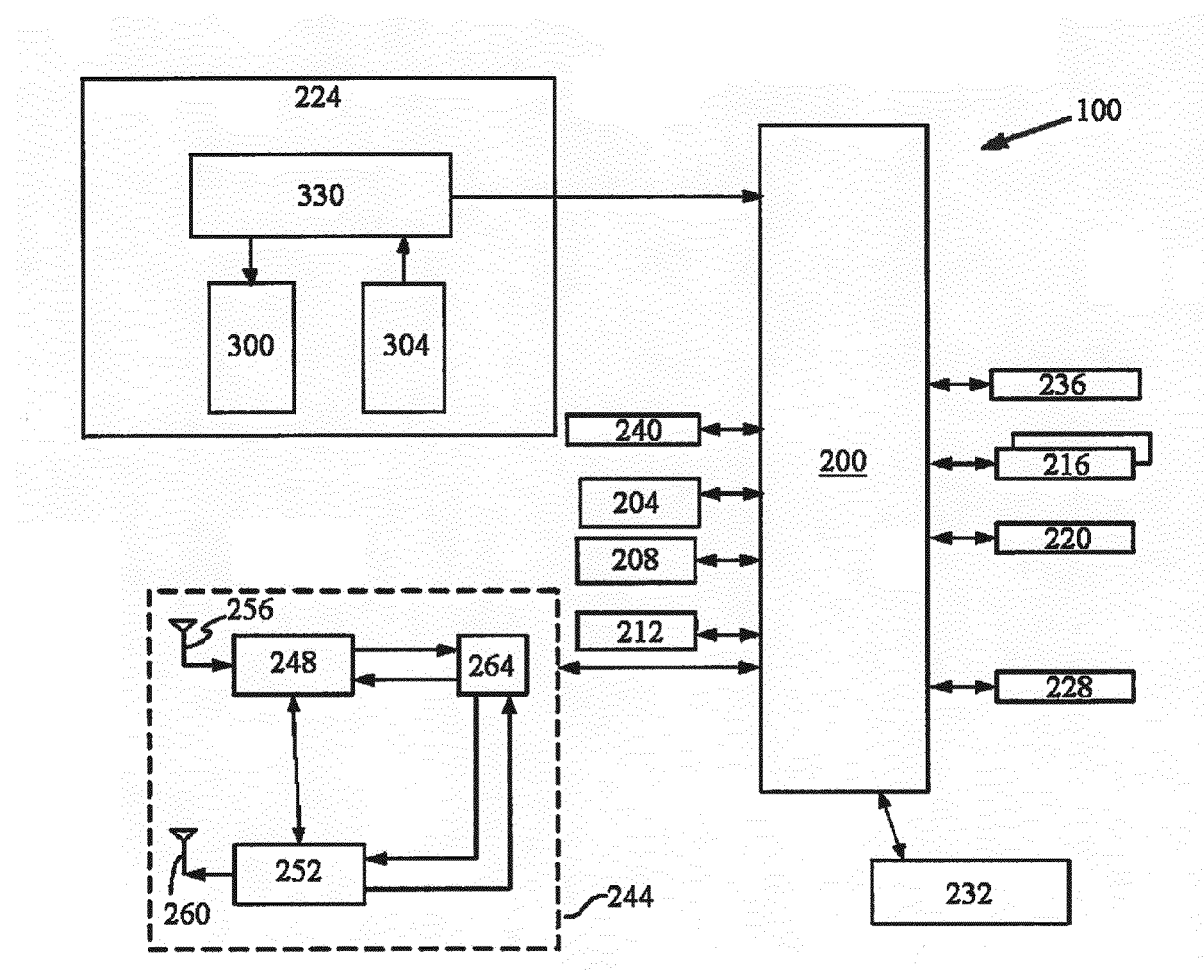
FIG. 2 shows a block diagram of functional subsystems of the computing device of FIG. 1.

Housing 104 defines a volume in which electronic and other subsystems and components, discussed below with reference to FIG. 2, are located to provide the necessary functionalities for computing device 100. In the illustrated embodiment, housing 104 includes gaskets and/or other structures and features which are intended to seal the volume in at least portions of housing 104 to prevent the ingress of foreign matter which could adversely affect the operation of computing device 100. In a present embodiment, device 100 can be a device such as an OMNII™ XT10 handheld computing device, as manufactured by the assignee of the present invention, but it will be apparent to those of skill in the art that the present invention can be employed with a wide variety of computing devices and/or as a separate input mechanism for a computing device.

Referring now to FIG. 2, a block diagram of the functional subsystems of one example of computing device 100 is shown. Computing device 100 includes a microprocessor 200 which controls general operation of computing device 100. Microprocessor 200 also interacts with a variety of functional device subsystems (if present), such as a display screen module 204, a nonvolatile memory 208, random access memory (RAM) 212, auxiliary input/output (I/O) subsystems 216, serial port 220, keyboard 224, speaker 228, short-range communications subsystem 232, such as a Bluetooth™ or RFID radio system for example, and Universal Serial Bus (USB) expansion port 236 for peripherals. If intended for portable use, computing device 100 can also include a power source such as battery module 240 which may also be removable and replaceable from computing device 100.

Computing device 100 can include a wired and/or wireless communication capability and, in the wireless configuration, computing device 100 typically includes radio frequency (RF) communication subsystem 244, which includes a receiver 248, a transmitter 252, and associated components, such as one or more embedded or internal antenna elements 256 and 260, and a processing module such as a digital signal processor (DSP) 264. As will be apparent to those skilled in field of communications, the particular design of RE communication subsystem 244 depends on the specific communication network in which computing device 100 is intended to operate, but can include communication functionalities such as Wi-Fi WLAN based on IEEE 802.11 standards, cellular data systems, such as EDGE, LTE, HSPA, etc. and other RF communications systems such as Zigbee, Z-Wave and the like.

Still with regard to FIG. 2, operating system software used by microprocessor 200 may be stored in a persistent store such as flash memory 208, which may alternatively be a read-only memory (ROM) or similar storage element (not shown). Those skilled in the art will appreciate that the operating system, specific device applications, or parts thereof, may be temporarily loaded into a volatile store such as RAM 212.

Microprocessor 200, in addition to its operating system functions, enables execution of software applications on computing device 100. A predetermined set of applications, which control basic device operations, or even more customized, advanced device operations, may be installed on computing device 100 during its manufacture, such as during the components configuration process described herein.

Display screen module 204 of computing device 100 can be used to visually present a software application's graphical user interface (GUI) to a user via a display screen. Display screen module 204 may employ a touch screen display, in which case the user can manipulate application data by modifying information on the GUI using direct touches by a finger or stylus. Depending on the type of computing device 100, the user may have access to other types of input devices, such as, for example, a scroll wheel, trackball or light pen.

A graphical user interface presented at display screen module 204 of computing device 100 may enable an operator or administrator to interact therewith. It further contemplated that computing device 100 may be communicatively coupled to a remotely located database (not shown).

Figure 3:
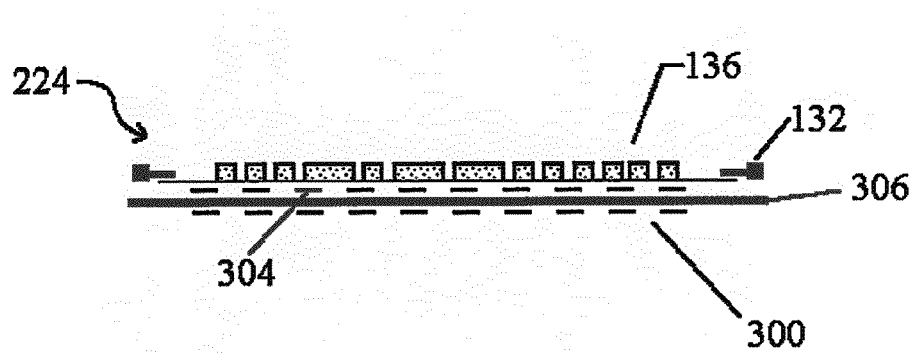
FIG. 3 shows a schematic representation of a cross section through the keyboard of FIG. 1 in accordance with the present invention.

As illustrated in FIGS. 3 through 6, keyboard 224 comprises a driver array 300 (best seen in FIG. 4), a sensor array 304 (best seen in FIG. 5) and a keypad 136, which may be maintained in place via bezel 132. As discussed below, driver array 300 and sensor array 304 can be formed on opposite sides of a substrate 306, as shown in FIG. 3, or can be formed on one side of a suitable substrate with a nonconductive material (not shown) between the elements of driver array 300 and sensor array 304.

Figure 4:
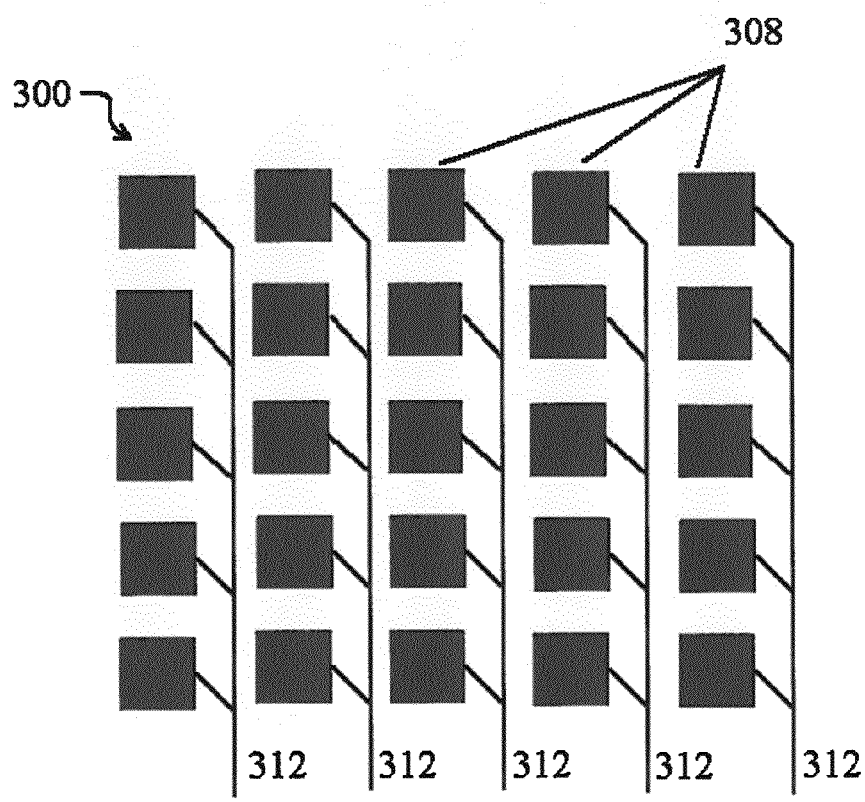
FIG. 4 shows a schematic representation of an array of driver elements for the keyboard of FIG. 1.

As shown in FIG. 4, an example of driver array 300 comprises a set of driver elements 308 which are conductive areas (typically, but not necessarily, rectangular in shape) which are each connected to one of a set of drive feed lines 312. In the illustrated embodiment, the driver elements 308 of each column (or alternatively, each row) in the array are connected to the same drive feed line 312. As will be apparent to those of skill in the arts such a column (or row) type arrangement is not required with the present invention and a variety of other organization schemes or methods can be employed as desired. For example, regions of adjacent, or alternate, etc. driver elements 308 can be driven by a single drive feed line 312 or each driver element 308 can have its own, unique, drive feed line 312, etc.

Figure 5:
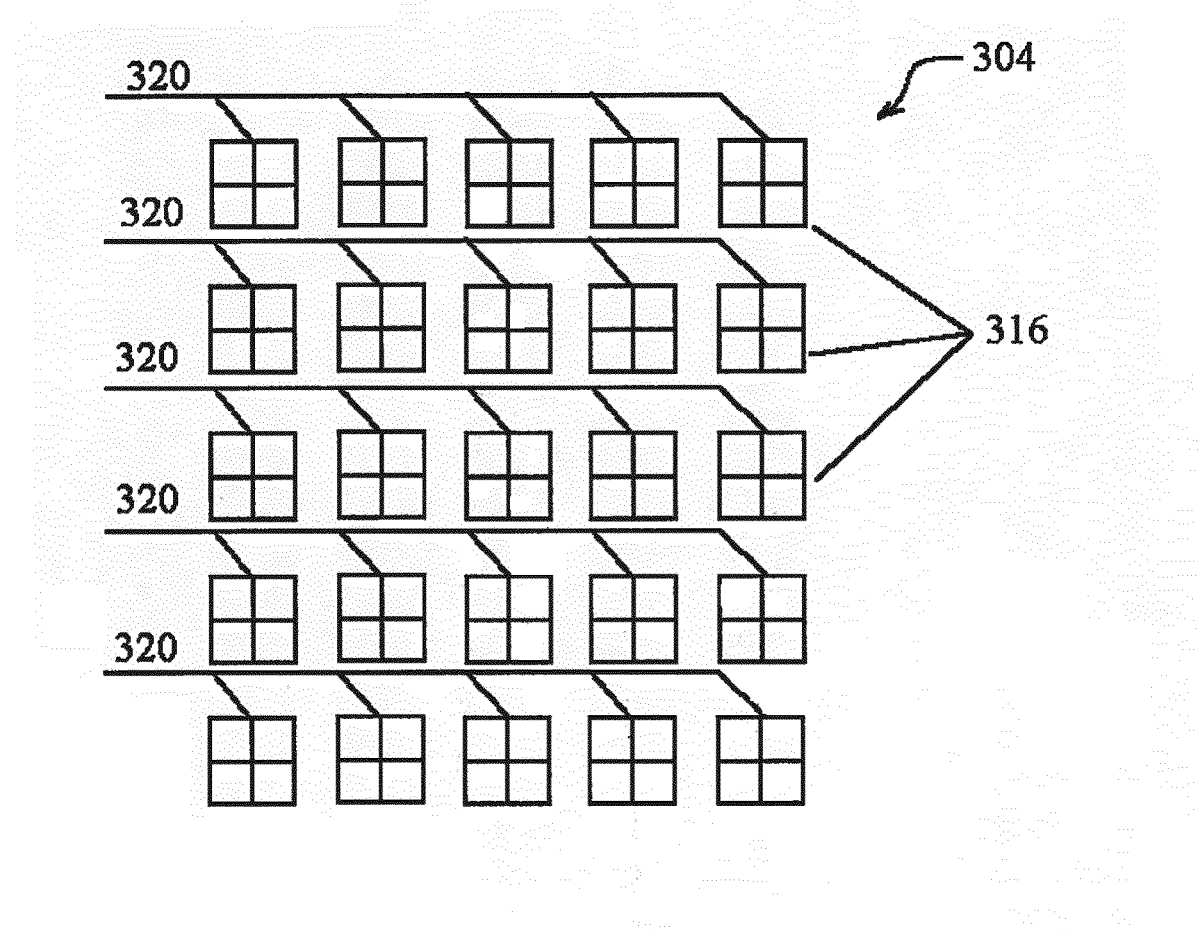
FIG. 5 shows a schematic representation of an array of sense elements for the keyboard of FIG. 1.

FIG. 5 shows an example of sensor array 304. Similar to driver array 300, sensor array 304 comprises a set of sense elements 316, each of which is connected to a sense signal line 320. Like the driver elements 308 of driver array 300, in the illustrated example, the sense elements 316 of each row (or column) in the array are connected to the same sense signal line 312. Again, as will be apparent to those of skill in the art, such a row (or column) type arrangement is not required with the present invention and a variety of other organization schemes or methods can be employed as desired. What is required is that corresponding pairs of a driver element 308 and sense element 316 can be appropriately accessed, as described in more detail below.

Figure 6:
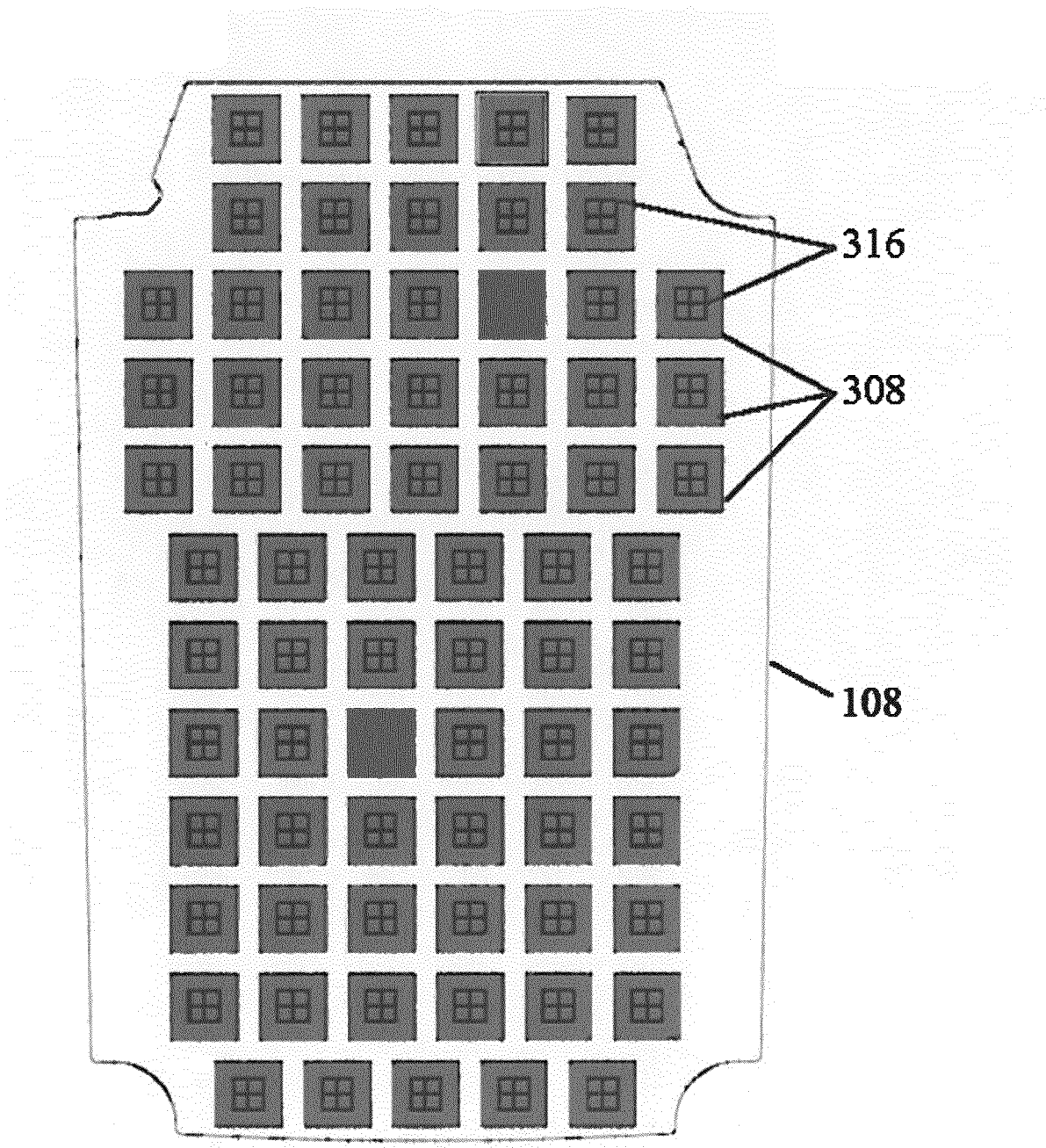
FIG. 6 shows a schematic representation of an example arrangement of overlying sense element and driver element pairs for the keyboard of FIG. 1.

FIG. 6 shows one possible layout of overlying pairs of driver elements 308 and sense elements 316. As will be apparent to those of skill in the art, other geometrical layouts and/or numbers of overlying pairs of driver elements 308 and sense elements 316 can be employed as required.

Figure 7:
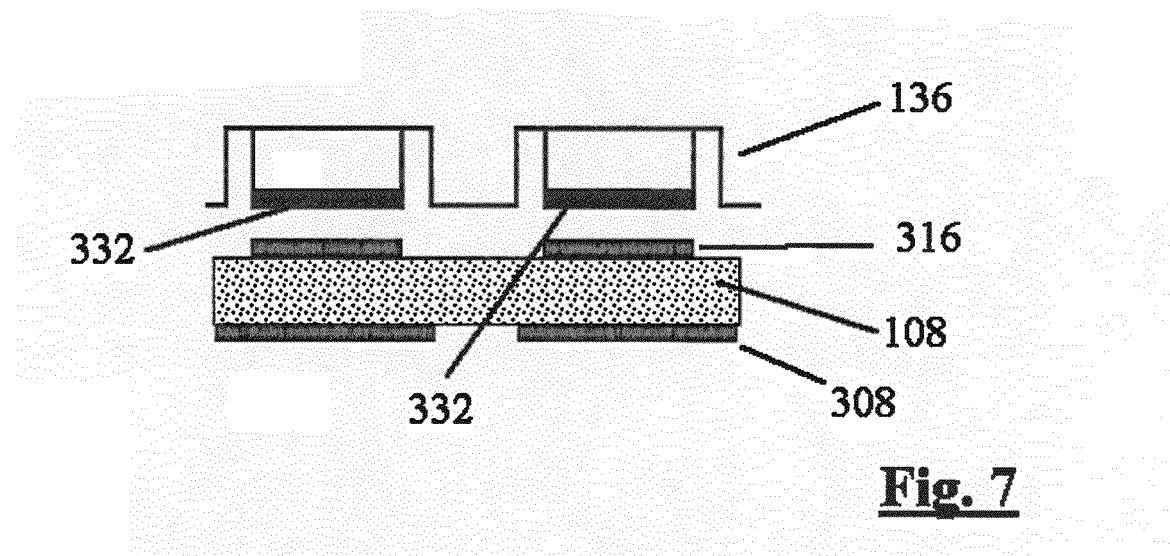
FIG. 7 shows a cross section through a portion of the keyboard of FIG. 1 showing an arrangement of the driver elements, sense elements and keys.

In the embodiment of FIG. 7, substrate 306 comprises front shell component 108 and driver elements 308 are located on the interior surface of front shell component 108 and sense elements 316 are located on the exterior surface of front shell component 108. Each sense element 316 overlies one corresponding driver element 308 to form a sensor pair.

Driver elements 308 and sense elements 316 can be fabricated in any suitable manner, as will occur to those of skill in the art. For example, in a present embodiment of the invention, driver elements 308, and drive feed lines 312, are formed by metalizing the desired areas on the interior surface of front shell component 108 with an appropriate metallization process. Similarly, sense elements 316, and sense signal lines 320, are formed by metalizing the desired areas on the exterior surface of front shell component 108 with an appropriate metallization process.

Alternatively, driver elements 308 and drive feed lines 312 can be formed on a separate substrate 306 which is then affixed to the interior or exterior of front shell component 108. Such substrates can comprise mylar sheets, which can have metalized areas formed on opposite sides thereof, printed circuit boards or any other suitable substrate as would occur to those of skill in the art. Similarly, sense elements 316 and sense signal lines 320 can be formed on a substrate (not shown) which is then affixed to the interior or exterior of front shell component 108.

As will be apparent to those of skill in the art, the present invention is not limited to the fabrication of one or more of driver elements 308, sense elements 316, drive feed lines 312 and sense signal lines 320 from metals and, instead, any or all of these elements can be fabricated from any suitable conductive material.

In another embodiment, driver elements 308, and drive feed lines 312 are formed on one side of a substrate and sense elements 316 and sense signal lines 320 are formed on the opposite side of the substrate and the substrate is affixed to the interior, or exterior, of front shell component 108.

In yet another embodiment, driver elements 308, and drive feed lines 312 are formed on one side of a substrate 306 and a nonconductive material is applied over them and then sense elements 316 and sense signal lines 320 are formed on top of the non-conductive material and substrate 306 is affixed to the interior, or exterior, of front shell component 108 with the side of substrate 306 on which the driver array 300 and the sensor array 304 are formed being located adjacent the location of keypad 136.

Keypad 136 is formed of a resilient, deformable (and preferably elastomeric) material which is placed over the overlying pairs of driver elements 308 and sense elements 316. This allows a desired set of keys to be formed on one elastomeric sheet, for example, to obtain keypad 136, which can then be mounted to device 100 via a simple mounting method, such as via bezel 132. The use of a resilient deformable keypad 136 reduces manufacturing and assembly expense in comparison to mechanical-type keyboards which employ individual key assemblies with multiple moving parts, yet still provides tactile feedback to a user.

As will be apparent to those of skill in the art, in each overlying pair of driver element 308 and corresponding sense element 316, the driver element 308 and sense element 316 each act as one respective plate of a capacitor. In use, a voltage which is applied between an electrical ground and a driver element 308 will create an electric field about the driver element 308 which will result in a charge, and hence voltage, being established between the corresponding overlying sense element 316 and the ground.

The relationship between the voltage applied to driver element 308 and the charge, and the voltage created thereby, at corresponding sense element 316 is deterministic but is subject to a variety of physical characteristics including the dielectric value of the material(s) within the electric field about the driver element 308 and the sense element 316. As will be described in more detail below, in the present invention pressing a key on keypad 136 alters the dielectric value of the material(s) within the electric field of at least one overlying pair of drive 308 element and sense element 316 thus altering, in a detectable manner, the relationship between the applied voltage, the charge and the created voltage.

Figure 8:
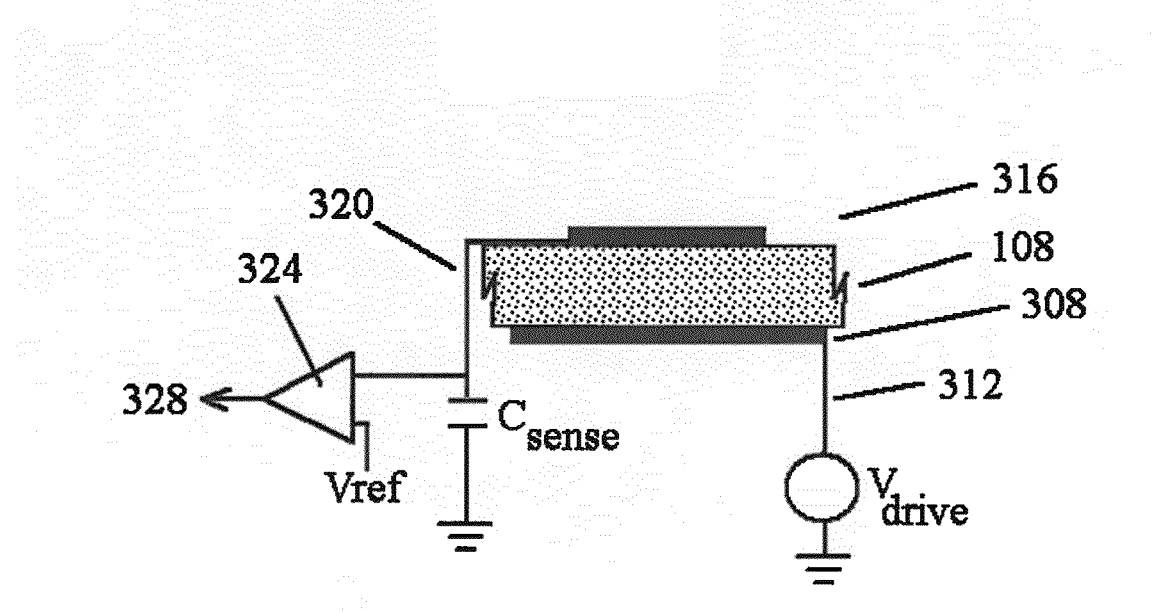
FIG. 8 shows a schematic representation of a driver element, sense element and electric circuitry of the keyboard of FIG. 1 for sensing a key press.
Figure 9A:
FIG. 9 shows schematic representations of some other possible sense element configurations for use with the keyboard of FIG. 1.
Figure 9B:
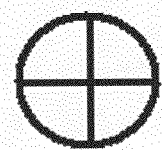
Figure 9C:
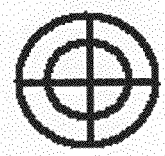
Figure 9D:
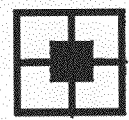

FIG. 8 shows one arrangement for detecting a key press on keypad 136 by detecting a change in the dielectric value of the material(s) within the electric field about a sense element 316 and the driver element 308 it overlies. As shown, a voltage source provides a drive voltage, $V_{drive}$, which is applied to drive feed line 312 and thus to each driver element 308 connected thereto. In the present embodiment, $V_{drive}$ is a square wave signal (varying from 0 to 1.8V) applied to drive feed line 312 at a fixed frequency, such as 100 kHz. However, as will be apparent to those of skill in the art, the present invention is not limited to drive voltages with a square waveform, or any other particular type of wave form. Similarly, the present invention is not limited to any particular frequency of drive voltage, provided only that a sufficient charge can be formed, and measured, on each sense element 316 of keyboard 224 within a reasonable time to ensure that one or more key presses can be timely detected.

The voltage applied to driver element 308 creates an electric field which charges sense element 316 and that charge flows to a sensing capacitor $C_{sense}$ which is connected to it via sense line 320. An analog comparator 324 compares the voltage at $C_{sense}$ to a pre-selected reference voltage, $V_{ref}$, and outputs a signal 328 when the voltage at $C_{sense}$ equals, or exceeds, $V_{ref}$.

In a present embodiment of the invention a microcontroller 330, specifically an AT32UCL064 microcontroller, manufactured by Amtel Corporation, 2325 Orchard Parkway, San Jose, Calif. is used to implement the driving and sensing of keyboard 224. This microcontroller provides: selection circuitry to select sense signal line(s) 320 to read sense element 316; selection circuitry to select drive feed line(s) 312; pulse generation circuitry to provide $V_{drive}$ to driver elements 308 connected to selected drive feed line(s) 312; sense capacitors $C_{sense}$ for each sense signal line 320; analog comparator 324 to determine when a selected sense element 316 is charged to a level equal to or exceeding $v_{ref}$ and to produce corresponding output 328; timing services to detect changes in the time required to receive output 328; and appropriate circuitry to discharge sensing capacitors $C_{sense}$ to ground to allow the next cycle of determining if a key has been pressed to start.

As will be apparent to those of skill in the art, the present invention is not limited to use of an Amtel microcontroller, or any other microcontroller, and can instead be implemented in a wide variety of manners, including via separate voltage supply, selector, timing and computing circuits and/or devices, as will occur to those of skill in the art. It is also contemplated that many other methods of detecting a change in the dielectric value of the materials within the electric field can be employed with the present invention, as will be apparent to those of skill in the art.

In use, an overlying pair of sense element 316 and driver element 308 is first calibrated to determine the number of pulses (i.e.—the time) for $V_{drive}$ to trigger output 328 (i.e.— when the voltage at $C_{sense}$ is at least equal to $V_{ref}$). The determined number of pulses (or the equivalent time value) is stored for the sense element 316/driver element 308 pair.

When a key on keypad 136 is depressed moving a portion of keypad 136 closer to sense element 316 (as discussed further below), the dielectric value of the materials within the electric field of the corresponding driver element 308 changes. This change in the dielectric value changes the time (i.e.—number of pulses) required to charge $C_{sense}$ to the point where its voltage equals or exceeds $V_{ref}$.

If the depressed key has a high dielectric constant, the time required to charge sense element 316 to the point where the voltage on $C_{sense}$ equals, or exceeds, $V_{ref}$ decreases. If the depressed key is a conductor (has a low dielectric constant), the time to charge sense element 316 to the point where the voltage on $C_{sense}$ equals, or exceeds, $V_{ref}$ increases.

In either case, the change in the time required to charge sense element 316 is easily detected by comparing the number of pulses (or time) of $V_{drive}$ required to trigger output 328 and comparing that number to the calibration value previously determined and stored. Thus key press of keypad 132 can be easily detected.

In a present embodiment, keypad 136 is an elastomeric material which is deformed when a key is pressed. This deformation provides a tactile feedback to a user while moving the depressed key closer towards one or more sense elements 316. While the elastomeric material itself will alter the dielectric value about sense elements 316, for increased detection sensitivity the present inventors have added at least one activation element 332 (best seen in FIG. 7) to each key of keypad 136 to increase the amount by which the dielectric value about sense elements 316 is changed by the depressing of a key, increasing the overall detection sensitivity of the system.

Activation element 332 can be a material with a higher dielectric constant than that of the elastomeric material, or can be a conductor (i.e.—an anti-dielectric, or low dielectric constant). Large keys, keys with irregular shapes, etc. can have more than one activation element 332 to ensure that the desired alteration of the dielectric value at sense element(s) 316 can be detected, All activation elements 332 in a keyboard can be formed of the same material (high dielectric or conductor). However, it is also contemplated that in some circumstances it may be desirable to employ different materials as activation elements 332 for different keys. For example, conductor and high dielectric materials can be employed for adjacent keys in an alternating manner to enhance the sensitivity of keyboard 224.

In the case of activation element 332 being a material with a relatively high dielectric (higher than the elastomeric material), the time to charge a sense element 316 to $V_{ref}$ is reduced when a key is depressed to bring an activation element 332 closer to a sense element 316. Thus a key press is detected when a sensor element 316 is charged to a voltage equal to or greater than $V_{ref}$ in a time less than the previously calibrated time.

In the case of activation element 332 being a material with a low dielectric, such as a conductor, the time to charge a sense element 316 to $V_{ref}$ is increased when an adjacent key is depressed to bring an activation element 332 closer to sense element 316. Thus a key press is detected when a sensor element 316 is charged to a voltage equal to or greater than $V_{ref}$ in a time greater than the previously calibrated time.

In FIG. 3, driver elements 308 are shown as solid areas of conductive material (in the illustration, rectangles of metal) and in FIG. 5 sense elements 316 are shown as open structures having a cruciform inner structure. It is presently preferred that sense elements 316 have an open structure, rather than a solid metalized area, to increase the effect of the presence of a key (and preferably an activation element 332) on the charge rate of the sense elements 316. By employing a sense element 316 with an open structure, the charge rate of the sense element 318 is more sensitive to the introduction of a high, or low, dielectric material to the vicinity of the sense element 316.

As will be apparent to those of skill in the art, sense element 316 can be arranged in a variety of open structures in addition to that shown in FIGS. 5 and 6 including those shown, by way of example only, in FIGS. 9a, 9b, 9c and 9d.

As best seen in FIG. 6, preferably driver elements 308 have a larger area than sense elements 316 to ensure that sense elements 316 are well within the electric field created by charging driver elements 308.

Scanning rows and columns of keyboards to detect a key press state is a well known technology. In such systems, a row of keys are energized and columns of keys are sensed (or vice versa) to detect the press of a key. However, the present invention differs from conventional keyboards employing row/column scanning as, with the present invention, there is not necessarily a one to one correspondence between individual keys on keypad 136 and an overlying pair of driver elements 308 and sense elements 316. As will be described in more detail below, there can be more, or less, keys on keypad 136 than sense elements 316. Further, the present invention allows for multi-touch input (i.e.—the simultaneous input/pressing of more than one key on keypad 136), as described below.

Figure 10:
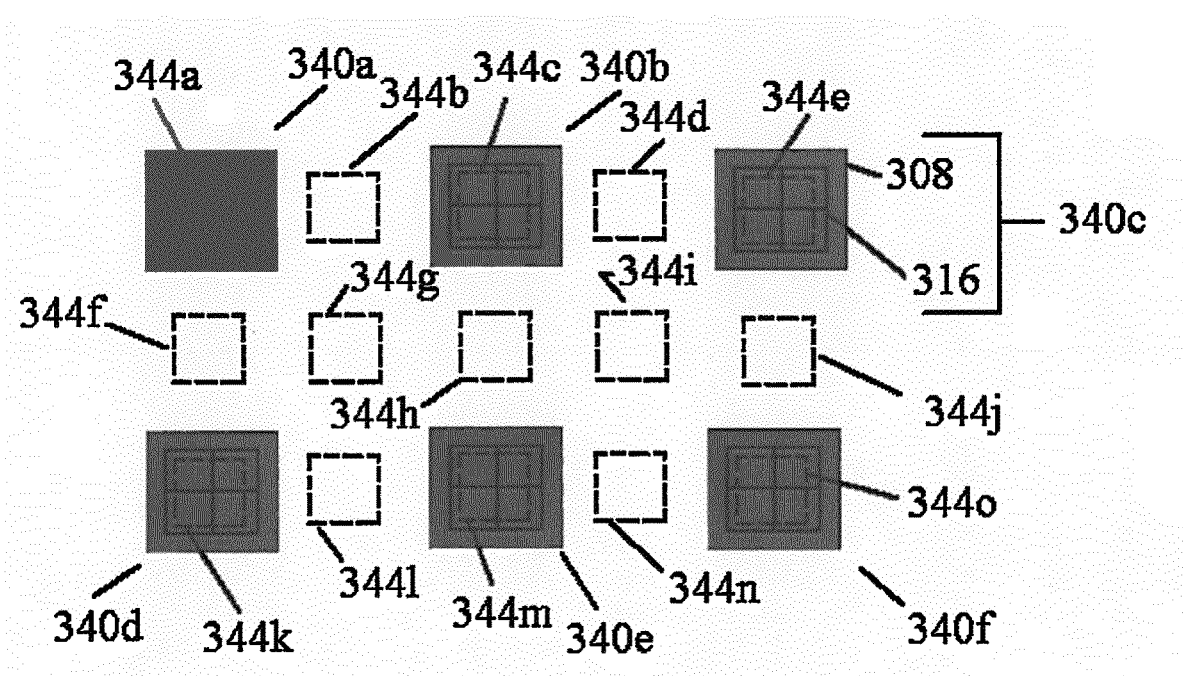
FIG. 10 shows a respective arrangement of overlying pairs of driver and sense elements and keys of the keyboard of FIG. 1.

FIG. 10 shows a portion (not to scale) of a keyboard in accordance with the present invention which includes an array of six sensor pairs (340a through 340f), of overlying driver elements 308 and sense elements 316. In the illustrated example, fifteen keys (344a through 344o) as indicated in dashed lines, are employed on the keypad.

If key 344a is pressed, moving it (and its activation element 332, if present) closer towards sensor pair 340a, the dielectric value of the materials about the sense element 316 is changed such that the rate of charging of the sense element 316 in pair 340a is changed. This change is detected by microcontroller 330, as described above, and the corresponding output signal 328 is provided to microprocessor 200 which, according to a predefined keyboard mapping, determines that key 344a has been pressed.

If key 344b is depressed, moving it (and its activation element 332, if present) closer towards both sensor pairs 340a and 340b, the dielectric value of materials about the sense elements 316 of each of pairs 340a and 340b is changed such that the rate of charging of the sense element 316 in each of pairs 340a and 340b is changed. However, as key 344b is not directly over top of either sensor pair 340a or 340b, the degree of the change in the dielectric value of the materials about the respective sense elements 316 will be less than would be the case for the press of a key centered over top of a sensor pair.

In any event, these somewhat smaller changes are detected by microcontroller 330, as described above, and the corresponding output signals 328 are provided to microprocessor 200 which, according to the predefined keyboard mapping, determines from the changed signals for both of sensor pairs 340a and 340b that key 344b has been pressed.

As mentioned above, the present invention enables multi-touch input wherein two or more keys 344 can be pressed at the same time. In such a case, processing of signals from the sensor pairs 340 proceeds as described above, but interpretation of those signals is slightly different. For example, if keys 344a and 344b are simultaneously pressed, the dielectric value at sensor pair 340a will be changed (and detected) and the dielectric value at sensor pair 340b will be changed (and also detected).

However, the magnitude of the change in the dielectric value at sensor 340a will be slightly larger than would be the case if only key 344a had been pressed, as the pressing of key 344b will also affect the dielectric value about sensor 340a. Further, the dielectric value at sensor 340b will change by the pressing of key 344b (but the change will be of less of a magnitude than if key 344c has been pressed due to the distance of key 344b from sensor 340b). Thus, the determined high amount of change at sensor 344a and the determined moderate change at sensor 344b can be interpreted, in view of the key map, as a press of key 344a and a press of key 344b.

As a further example, if key 344a and key 344h are pressed, the dielectric value at sensor 340a will be changed by an amount indicating that key 344a has been pressed and the dielectric value at sensors 340b and 340e will change. The change detected by sensor 340a will be interpreted, in view of the key map, as a press of key 344a while the change detected by sensors 340b and 340e will be interpreted, in view of the key map, as a press of key 344h.

The method of processing key presses of the remaining keys should now be apparent to those of skill in the art. For example: pressing key 344f will affect the charge rates of sensor pairs 340a and 340d; and pressing key 344g will affect the charge rates of sensor pairs 340a, 340b, 340d and 340m. In each case, the sensor pairs 340 with affected charge rates will be reported to microprocessor 200 by microcontroller 330 and microprocessor 200 determines, in accordance with the predefined keyboard mapping which key, or keys, have been pressed.

The actual layout and mapping of keys 344 to sensor pairs 340 can vary widely, as desired. For example, not all keys 344 need be the same size or shape and the arrangement and layout of the keys 344 need not be rectilinear or otherwise directly correspond to the layout of sensor pairs 340. Instead, it is contemplated that the keyboard map provided to microprocessor 200 will define sets of one or more sensor pairs where a detected change in the charge rate of those sensor pairs is associated with the press of a particular key 344 by the map. As mentioned in the examples above, a key press may be detected from a change in more than one sensor pair 340 and/or by the degree of such a change.

This ability to create a key map associating one or more sensor pairs 340 to keys 344 allows keyboard 224 to be very versatile. By employing different keypads 136 in keyboard 224, different numbers, arrangements, shapes and sizes of keys can easily and simply be provided as desired. To provide a new layout of keyboard 224, it is merely necessary to create a keypad 136 with the desired arrangement of keys 344 and to define an appropriate key map of sensor pairs 340 for that keypad and to provide that map to microprocessor 200 before or when the new keypad 136 is installed.

In some circumstances, even the presence of an activation element 332 in a key may not be sufficient to ensure a measurable change in the charge rate of a sense element 316. For example, if driver array 300 and sensor array 304 are located on an inner surface of front shell component 108 and keypad 136 is mounted to the exterior surface of front shell component 108, the change in the dielectric value of materials about a sensor pair 340, may be difficult to detect due to the thickness (and/or material) of front shell component 108, even with the presence of an activation element 332 in the pressed key.

In such a case, it is desired to enhance the dielectric value of the keypad and/or activation element 332. Specifically, the induced change in the dielectric value at one or more sensor pairs 340 resulting from the movement of a key including an activation element 332 is enhanced by electrically grounding the activation element 332 which, in such an embodiment, is an electrically conductive activation element 332.

In one embodiment of the present invention, keypad 136 can include flexible conductive elements, such as carbon filament conductors, copper mesh conductors, etc., embedded in keypad 136 which interconnect the conductive activation elements 332 in keypad 136. By interconnecting rows, columns, other sets or all of activation elements 332 to each other, the overall dielectric changing effect of an activation element 332 is enhanced.

Alternatively, if activation elements 332 are connected to an electrical ground connection which can, for example, be provided on housing 104, the overall dielectric changing effect of an activation element 332 can be further enhanced. As will be apparent, in this embodiment activation elements 332 are electrical conductors and by grounding activation elements 332 a larger change in the dielectric value about a sensor pair will result from a key press than could otherwise be easily obtained.

Figure 11:
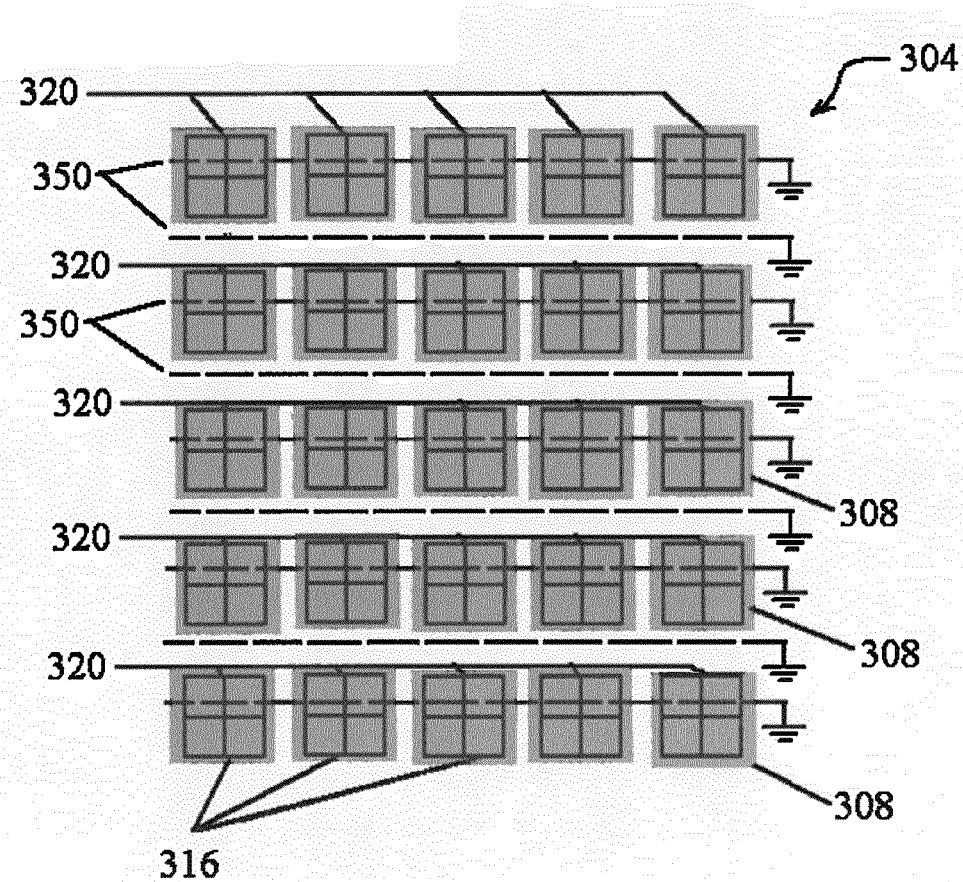
FIG. 11 shows schematic representation of an array of overlying pairs of sense elements and driver elements for the keyboard of FIG. 1 wherein the array includes a set of ground lines.
Figure 12:
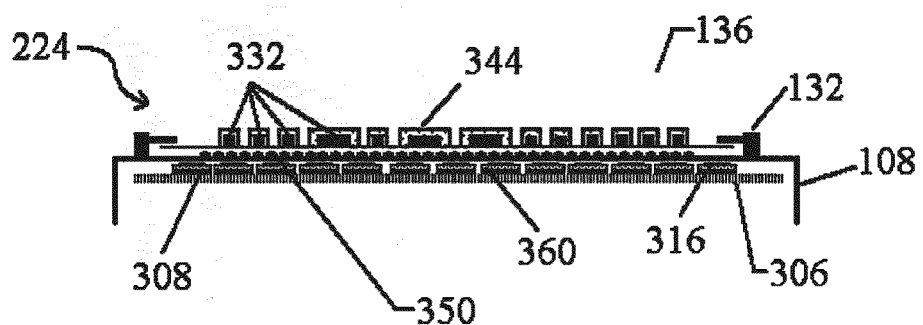
FIG. 12 shows a cross section through the keyboard of FIG. 1 employing the array of FIG. 11.

In another embodiment of the present invention, shown in FIGS. 11 and 12, one or more electrically grounded conductors 350 are located over, but electrically insulated from, or adjacent to, sensor elements 316. Grounded conductors 350 are physically quite small and do not significantly affect the charge rates of any sense element 316 which they overlie. However, when a key on keypad 136 is pressed, the activation element 332 (or activation elements 332) on the respective key contacts one or more grounded conductors 350 to electrically ground the activation element 332 (which in these embodiments is an electrical conductor). As best seen in FIG. 12, in this embodiment driver elements 308 and sense elements 316 are both mounted on one side of substrate 306, with an insulating material 360 between them, and substrate 306 is mounted to the interior surface of front shell component 108.

It is contemplated that a keypad 136 will be installed on keyboard 224 at the time of manufacture of device 100 and a keyboard map corresponding to the particular installed keypad 136 will be loaded into device 100.

In the event that keypad 136 subsequently needs to be replaced, for example if existing keypad 138 had been damaged due to abuse or prolonged usage, the replacement can be easily effected by removing bezel 132, or other means of retaining keypad 136 is place, removing the damaged keypad 136, placing the replacement keypad 136 in place and reinstalling bezel 132 or any other retaining means. In this case, the keyboard mapping used by device 100 to interpret signals from sense elements 316 and to associate those signals with the press of a key is unchanged.

Alternatively, if a user desires to replace an installed keypad 136 with a different keypad (for example switching from a keypad designed primarily for alphanumeric input to one designed primarily for numeric input, or switching from a QWERTY key layout to a AZERTY key layout), it is necessary to change the keyboard mapping used by device 100.

In one embodiment, multiple keyboard maps are loaded into device 100. These multiple keyboard maps can be loaded in at time of manufacture of device 100 and/or can be subsequently loaded as part of a software update or as a separate specific step for the installation of a keypad 136.

In any event, each loaded keyboard map can have a predefined and unique set of identifying keystrokes associated with it. Via an appropriate configuration process, such as at a cold start up, or "factory reset", of device 100, the user can enter the identifying keystrokes defined for the installed keypad 136. As part of the configuration process, device 100 compares the entered keystrokes to a table of signals from sense elements 316, stored in device 100, where each entry in the table identifies a particular keypad 136 and its associated key map.

Thus, for example, in the configuration process the instructions provided with the keypad may tell the user to enter "Q", "P", "Z" and "M" keys to identify a QWERTY keypad 136 or the instructions may tell the user to enter "Q", "W", "Spacebar" and "Tab" to identify an AZERTY keypad. As will be apparent to those of skill in the art, during this configuration process a key map is not selected for the keypad 136 and thus device 100 processes the raw signals received from sense elements 316 and selects the appropriate key map from the table of key maps by considering the raw signals from the sense elements 316 and comparing them to the index of the table.

Alternatively, an appropriate key map can be supplied with keypad 136 and loaded into device 100 via any appropriate means, such as via a USB memory stick or SD memory card, etc. or via any other of a wide variety of loading means as will be apparent those of skill in the art.

As will also be apparent to those of skill in the art, the present invention is not limited to the techniques disclosed above for associating a key map with a keypad 136 and a wide variety of other techniques and methods can be employed. For example, device 100 can include an RFID reader or a barcode imager or scanner which would allow an identifying code to be read to identify keypad 136 such that the appropriate key map can be selected.

In another embodiment, one or more sensor pairs 340 can be dedicated to use to identify the installed keypad 136. In this embodiment, dielectric indicators (such as markers made of dielectric materials or metal) are embedded in, or otherwise attached to, predefined positions on keypad 136 which overlie the dedicated sensor pairs 340. By arranging the dielectric indicators in different patterns, different keypads 136 can be identified and appropriate key mappings installed and/or employed automatically on device 100.

The present invention provides a novel capacitive sensing keyboard which allows for keypads to be easily changed for repair or reconfiguration purposes. The keypads can be made of a deformable and resilient material, such as an elastomer, which can provide tactile feedback to a user and which are relatively inexpensive to manufacture. An array of overlying pairs of driver elements and sense elements are located adjacent the keypad and changes in the dielectric value of materials about the driver/sense element pairs are detected when a key on the keypad is pressed by a user. These detected changes are processed in view of a defined key map to determine which key or keys have been pressed by the user. A variety of keypads can be employed, with different numbers and/or configurations of keys, only requiring that an appropriate key map, associating signals from one or more overlying pairs of driver elements and sense elements to keys on the keypad, be used to determine the keys pressed. The keyboard has no moving parts, and is thus relatively robust, and advantageously and easily lends itself to use with sealed electronic enclosures.

The above-described embodiments of the invention are intended to be examples of the present invention and alterations and modifications may be effected thereto, by those of skill in the art, without departing from the scope of the invention which is defined solely by the claims appended hereto.

What is claimed is:

1. A keyboard for detecting a key press and providing corresponding input data to an electronic device, the keyboard comprising:
    a substrate;
    at least two driver elements on the substrate;
    at least two sense elements on the substrate, each sense element overlying a respective driver element;
    a voltage source;

a selector to selectively apply voltage from the voltage source to at least one of the at least two driver elements to induce an electric field about the respective driver element and its respective overlying sense element to create a charge and corresponding voltage on the respective sense element;

a timer to determine the time required for the created corresponding voltage on the respective sense element to reach a predefined voltage;

a keypad having at least one key formed thereon, the keypad being formed of a resilient and deformable material, the at least one key being located adjacent at least one of the at least two sense elements such that when the at least one key is depressed, the dielectric value of the materials within the induced electric field is altered, the altered dielectric value changing the time required for the created charge on the respective sense element to reach a predefined voltage;

a computing device responsive to changes in the time required for the corresponding voltage on the respective sense element to reach the predefined voltage and responsive to a predefined key map relating keys on the keypad to the position of sense elements on the substrate to determine which key has been depressed and outputting an indication of that key as input data to the electronic device.

2. A keyboard according to claim 1 wherein the at least two driver elements are located on a first side of the substrate and the at least at least two sense elements are located on a second side of the substrate.

3. A keyboard according to claim 2 wherein the substrate is a portion of a housing for the electronic device.

4. A keyboard according to claim 1 wherein the at least two driver elements are located on a first side of the substrate and covered in an electrically insulating material and the at least two sense elements are located on the electrically insulating material and overlie the respective driver elements.

5. A keyboard according to claim 4 wherein the substrate is a portion of a housing for the electronic device.

6. A keyboard according to claim 1 wherein the substrate is a portion of a housing for the electronic device.

7. A keyboard according to claim 1 wherein the selector, voltage source, timer and computing device comprise subsystems of a microcontroller.

8. A keyboard according to claim 1 wherein a number of keys on the keypad exceeds a number of sense elements.

9. A keyboard according to claim 1 wherein the keypad is formed of an elastomeric material.

10. A keyboard according to claim 1 wherein the keypad is maintained in place via a bezel and the keypad can be replaced by removing the bezel, changing the keypad and replacing the bezel.

11. A keyboard according to claim 1 wherein the keypad can be exchanged for a keypad with at least one of a different number of keys, a different key layout and a different set of keys by exchanging the keypad and loading a corresponding predefined key map into the computing device.

12. A keyboard according to claim 1 wherein the keypad can be exchanged for a keypad with at least one of a different number of keys, a different key layout and a different set of keys by exchanging the keypad and selecting a corresponding predefined key map in the computing device.

13. A keyboard according to claim 12 wherein the selection of the corresponding predefined key map is performed by pressing a sequence of keys on the keypad.

14. A keyboard according to claim 12 wherein the selection of the corresponding predefined key map is performed by scanning a barcode with the electronic device.

15. A keyboard according to claim 12 wherein the selection of the corresponding predefined key map is performed by, with the electronic device, reading an RFID tag associated with the keypad.

16. A keyboard according to claim 12 wherein the keypad includes at least one predefined identifier which interacts with at least one sensor element to select the corresponding predefined key map.

17. A keyboard according to claim 1 wherein the at least one key formed on the keypad includes an activation element formed of a material selected to enhance the alteration of the dielectric value of the materials within the induced electric field change when the key is pressed.

18. A keyboard according to claim 17 wherein the activation element is a material which increases the dielectric value of the materials within the induced electric field.

19. A keyboard according to claim 17 wherein the activation element is a conductor which decreases the dielectric value of the materials within the induced electric field.

20. A keyboard according to claim 19 wherein the activation element is electrically grounded.

21. A keyboard according to claim 17 further comprising at least one grounded conductor arranged between the at least one key and the at least two sense elements such that when the at least one key is depressed, the activation element electrically contacts the grounded conductor and is grounded which decreases the dielectric value of the materials within the induced electric field.

22. A keyboard according to claim 17 wherein at least two of the activation elements of the key pad are electrically connected to each other.

* * * * *